United States Patent
Bacharouche et al.

(10) Patent No.: US 12,495,502 B2
(45) Date of Patent: Dec. 9, 2025

(54) METHOD FOR OBTAINING GLAZINGS PROVIDED WITH ELECTROCONDUCTIVE PATTERNS

(71) Applicant: SAINT-GOBAIN GLASS FRANCE, Courbevoie (FR)

(72) Inventors: Jalal Bacharouche, Clairoix (FR); André Beyrle, Tracy-le-Val (FR)

(73) Assignee: SAINT-GOBAIN SEKURIT FRANCE, Thourotte (FR)

( * ) Notice: Subject to any disclaimer, the term of this patent is extended or adjusted under 35 U.S.C. 154(b) by 183 days.

(21) Appl. No.: 17/773,751

(22) PCT Filed: Nov. 27, 2020

(86) PCT No.: PCT/EP2020/083723
§ 371 (c)(1),
(2) Date: May 2, 2022

(87) PCT Pub. No.: WO2021/105422
PCT Pub. Date: Jun. 3, 2021

(65) Prior Publication Data
US 2022/0418112 A1  Dec. 29, 2022

(30) Foreign Application Priority Data
Nov. 29, 2019 (FR) ...................................... 1913478

(51) Int. Cl.
*B41M 1/34* (2006.01)
*B41M 7/00* (2006.01)
(Continued)

(52) U.S. Cl.
CPC .............. *H05K 3/125* (2013.01); *B41M 1/34* (2013.01); *B41M 7/009* (2013.01); *H05K 1/0306* (2013.01); *H05K 3/1225* (2013.01)

(58) Field of Classification Search
CPC .... H05K 3/125; H05K 1/0306; H05K 3/1225; B41M 1/34; B41M 7/009; B41M 3/008;
(Continued)

(56) References Cited

U.S. PATENT DOCUMENTS 3,845,489 A * 10/1974 Sauer .................... H01Q 1/1271
343/893
3,900,634 A * 8/1975 Plumat ...................... B41M 1/34
252/514

(Continued)

FOREIGN PATENT DOCUMENTS

EP    EP 3 233 480 A1    10/2017
JP    S59-013404 A       1/1984
(Continued)

OTHER PUBLICATIONS

International Search Report as issued in International Patent Application No. PCT/EP2020/083723, dated Feb. 4, 2021.

(Continued)

*Primary Examiner* — Gordon Baldwin
*Assistant Examiner* — Christina D McClure
(74) *Attorney, Agent, or Firm* — Pillsbury Winthrop Shaw Pittman LLP

(57) ABSTRACT

A method for obtaining a glazing includes a glass sheet covered, on one of its faces with electroconductive patterns having in at least one area, a so-called extra thickness area, a greater thickness than in the other areas, the method including depositing by screenprinting a first electroconductive layer forming patterns on one side of the glass sheet, then depositing by a digital printing technique, in the or each extra thickness area, a second electroconductive layer on the first layer while the latter is still wet, then a heat treatment step to cure the first and the second layer.

13 Claims, 1 Drawing Sheet

(51) Int. Cl.
  *H05K 1/03* (2006.01)
  *H05K 3/12* (2006.01)
(58) Field of Classification Search
  CPC ... B41M 5/007; B41M 1/12; C03C 2218/119;
     C03C 17/36; C03C 17/3644; C03C
     17/3673; C03C 27/042; C03C 2217/256;
     C03C 17/10
  See application file for complete search history.

(56) References Cited

U.S. PATENT DOCUMENTS

| | | | | |
|---|---|---|---|---|
| 5,099,105 | A * | 3/1992 | Goerenz | H05B 3/86 219/203 |
| 5,388,509 | A * | 2/1995 | Cutcher | G03F 7/12 427/282 |
| 2006/0081581 | A1 | 4/2006 | Odeh | |
| 2006/0159899 | A1 * | 7/2006 | Edwards | H05K 1/16 428/209 |
| 2010/0144564 | A1 * | 6/2010 | Kamiya | F16C 33/206 508/108 |
| 2011/0017719 | A1 * | 1/2011 | Choi | H05B 3/84 29/611 |
| 2012/0152930 | A1 * | 6/2012 | Chamberlain | H05B 3/86 219/203 |
| 2013/0189524 | A1 * | 7/2013 | Hladik | C09D 7/70 427/372.2 |
| 2017/0006666 | A1 * | 1/2017 | Krause | B41F 15/46 |
| 2017/0347403 | A1 * | 11/2017 | Rano | B32B 17/10348 |
| 2018/0368268 | A1 * | 12/2018 | Werner | C03C 17/04 |

FOREIGN PATENT DOCUMENTS

| | | | |
|---|---|---|---|
| JP | S63-233838 A | 9/1988 | |
| JP | 2018-505832 A | 3/2018 | |
| JP | 2019-504469 A | 2/2019 | |
| JP | 2019-505458 A | 2/2019 | |
| WO | WO 2002/092674 A1 | 11/2002 | |
| WO | WO-02092674 A1 * | 11/2002 | .......... B01J 19/0046 |
| WO | WO 2009/053469 A2 | 4/2009 | |
| WO | WO 2016/097579 A1 | 6/2016 | |
| WO | WO-2017098164 A1 * | 6/2017 | ............ B23K 13/01 |
| WO | WO 2018/229449 A1 | 12/2018 | |
| WO | JR WO A1 2019/224231 | 11/2019 | |

OTHER PUBLICATIONS

Notice of Reasons for Refusal as issued in Japanese Patent Application No. 2022-531345, dated Oct. 19, 2024.

* cited by examiner

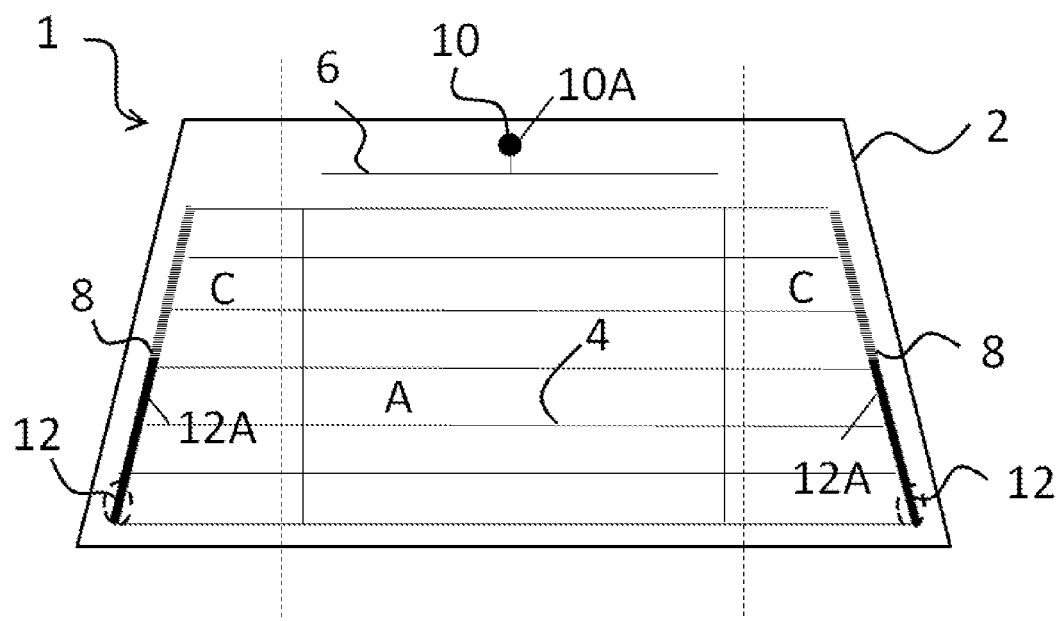

METHOD FOR OBTAINING GLAZINGS PROVIDED WITH ELECTROCONDUCTIVE PATTERNS

CROSS-REFERENCE TO RELATED APPLICATIONS

This application is the U.S. National Stage of PCT/EP2020/083723, filed Nov. 27, 2020, which in turn claims priority to French patent application number 1913478 filed Nov. 29, 2019. The content of these applications are incorporated herein by reference in their entireties.

The present invention relates to the printing of electroconductive patterns, particularly silver-based ones, on glazing.

Electroconductive patterns, such as heating wires, antennae or other sensors present in motor vehicle glazing, are made using conductive paste, for example a silver paste screenprinted on a sheet of glass, and are connected to a power supply system by means of connectors soldered to the conductive paste. The connectors are soldered in certain well-defined areas of the glazing and the alloys currently used in this soldering are lead-free, for example silver-based, tin-based or copper-based.

Glazings equipped with such electroconductive devices must, in order to be put on the market and accepted by motor vehicle manufacturers, pass increasingly stringent resistance tests. In particular, the alloys used in the soldering must fulfill the criteria imposed by the TCT ("Temperature Cycling Test"). The objective of this test is to determine if, once equipped with the electrical functions, the glazing can withstand successive and rapid increases and decreases in temperature, without being weakened. These tests were developed in order to accelerate the effects that would be triggered by differences in the thermal behavior of the various components of the system. The new test imposes temperature variations between −40° C. and +105° C., therefore over a greater range of variation than previous tests which stopped at 90° C. The number of cycles has also been changed, increasing from 10 cycles to a minimum of 60 cycles. The new TCT conditions also require that these temperature variations be carried out under a voltage of 14 V during the temperature increase phases, which leads to additional heating and corresponds to local temperatures which may rise to approximately 120° C. In order to pass these tests, it was found that the thickness of the electroconductive patterns must be increased, in particular in the soldered areas, where the connectors are placed and where the soldering with the lead-free alloy was carried out. In motor vehicle glazing, the areas of connection or of soldering are generally done at the bus bars located on both sides of the heating network, in the lateral portions of the glazing, but also can be done in more central portions.

It is well-known that screenprinting of electroconductive patterns of different thickness can be carried out in one step between the central portion and the side portions, using a single printing fabric (or mesh), the aperture size of which is variable depending on the areas and which enables patterns of different thickness to be printed. These fabrics facilitate, in particular, the deposition on the lateral portions of the glazings greater thicknesses of paste at the bus bars, while retaining in the central portion, thin and inconspicuous electroconductive tracks. Thus, the thickness is sufficiently large where the connections and soldering are undertaken, but sufficiently reduced in the central portion so as not to affect visibility. However, this type of fabric with apertures varying in size does not enable fine patterns and thicker patterns to be obtained in the central portion of the glazing at the same time. And yet, some soldering points, in particular with regard to the antenna buttons, are often positioned in the center of the printed heating networks, in the lower or upper areas of the central portion of the glazing. In order to achieve a thicker electroconductive pattern in some areas of the central portion of the glazing, it is possible to undertake dual screenprinting, since the meshes with variable aperture sizes facilitate greater thicknesses only in the lateral portions, at the edges of the glazing. Thus, in order to achieve greater thicknesses in the central portion of the glazings, a first print run is carried out by means of screenprinting of the electroconductive paste, then the paste is dried and a second print run is carried out, identical to the first, at a second printing station. Therefore, this technology requires significant investment, since an IR drying device and a second printing station, as a minimum, are required. In some cases, should even greater thickness be required, a third screenprinting step—along with an intermediate drying step—may be necessary.

Therefore, we are seeking to develop a simplified, less onerous, method which will facilitate the production of thick electroconductive patterns wherever they are desired and, in particular, in the central portion of a substrate, away from the bus bars.

One solution, proposed in application WO2018/229449, consists of using a screenprinting screen comprising a main mask and, in an area located in the central portion, at least one secondary mask attached to one face of said main mesh, the aperture size of the secondary mask being wider than that of the main mask in said central portion, and the mesh of the secondary mask forming, with that of the main mask, an angle α between 1 and 89°. Such a screen provides, in one screenprint run, glazings whose central portions possess thin electroconductive tracks and, in the areas of the double mesh, thus also in the central portion of the glazing, electroconductive patterns, for example soldering areas for particularly thick antenna buttons.

However, this solution is not without its disadvantages, in particular because it does not allow extra thickness in some specific areas of the lateral portions. Furthermore, it does not allow the completely independent adjusting of the thickness of the electroconductive tracks in the soldering areas and in the other areas. Consequently, it is not always possible to achieve the desired thicknesses in the soldering areas while respecting the network resistance specifications.

The goal of the invention is to obviate these shortcomings by proposing a method which allows for a glazing to be obtained at a lower cost and in which thick electroconductive patterns can be produced in certain areas of the central portion and in certain areas of the lateral portions.

In this regard, the objective of the invention is a method for obtaining a glazing comprising a sheet of glass covered, on one of its faces, with electroconductive patterns having in at least one area, so-called extra thickness area, a greater thickness than in the other areas, said method comprising depositing by screenprinting an initial electroconductive layer forming patterns on one face of said glass sheet, followed by depositing by means of a digital printing technique, in the or each extra thickness area, a second electroconductive layer on the first layer while the latter is still wet, then a heat treatment step for curing the first and the second layer.

A further purpose of the invention is a glazing. The glazing is, specifically, a glazing obtained or likely to be obtained by the method according to the invention. This glazing comprises a glass sheet covered on one of its faces with silver-based electroconductive patterns, having in at least one area, so-called extra thickness area, a greater thickness than in the other areas. Preferably, an extra thickness area is located in the central portion, and another extra thickness area is located in just one part of each lateral portion.

This invention completes the screenprinting step by a digital printing step, which produces extra thickness in the desired areas, typically the soldering areas or areas encompassing the soldering areas, which may be in the central and lateral portions of the glazing. In the areas of extra thickness, the electroconductive patterns therefore comprise two superimposed layers (the first and the second layer), while there is just one layer in the other areas.

Thus, a glazing comprising patterns comprising thin electroconductive tracks can be produced, for example a network of heating wires, an alarm network, antennae or bus bars, and soldering areas of greater thickness which may be located in the central and lateral portions of the glazing, for example soldering areas for antenna buttons located in the central portion and heating network soldering areas located in the lateral portion in contact with the bus bars.

The extra thickness areas are not necessarily limited to the soldering areas. In addition, the invention advantageously enables some areas of the bus bars to be thickened, notably close to the soldering areas, in particular to prevent unwanted heating.

The extra thickness guarantees robust soldering without affecting the resistance of the network of heating wires, which can be adjusted completely independently by means of the choice of thickness of the first layer. In this way, it is possible to meet the electrical resistance specifications, which are specific to each model, by choosing the silver paste, the screenprinting screen, the wet thicknesses, etc . . . , and to apply the appropriate extra thickness to achieve thicknesses that ensure effective soldering in the soldering areas or in the areas encompassing the soldering areas. In this regard, then, the method is very flexible.

Moreover, the techniques employed allow for the second layer to be deposited on the first layer while the latter is still wet. "Wet" should be understood to mean that the first layer has not yet been dried, and therefore includes a solvent. In this way, it is possible to proceed directly to the digital printing of the second layer without requiring an additional drying station between the two layering steps.

Preferably, a drying step is implemented between the depositing of the second layer and the curing heat treatment step.

Preferably, the electroconductive patterns comprise electroconductive tracks located in at least one lateral portion and in a central portion of the glazing, with the extra thickness areas being located in said central portion and/or in at least one lateral portion. Preferably, the extra thickness areas are located in both the central portion and in at least one lateral portion, and even in the lateral portions.

The electroconductive tracks located in the central portion are, in particular, heating wires, alarm films and/or antennae. The electroconductive tracks located in a lateral portion, particularly in two opposite lateral portions, are notably bus bars.

Advantageously, the extra thickness areas encompass soldering areas, and even correspond to the soldering areas. The extra thickness areas located in the central portion are or encompass for example soldering areas for connecting antennae or alarms. The extra thickness areas located in the lateral portions encompass for example soldering areas for connecting a heating network. The latter are for example located on each of the bus bars.

The soldering areas are areas on which a connector can be soldered in order to electrically connect the electroconductive patterns. Therefore, the method may also comprise an additional step of soldering at least one connector on at least one part of an extra thickness area. Soldering is in particular carried out using a solder alloy.

The connector typically is metallic, particularly steel containing chrome. The solder alloy preferably is lead-free, for example tin-based, silver-based or copper-based.

Typically, the glass sheet is made of soda-lime glass, but it can also be made of other types of glass, for example borosilicate or aluminosilicate. Preferably, it should be between 0.7 and 6 mm thick, in particular between 1 and 4 mm. At least one dimension of the glass sheet is preferably at least 1 m.

The glass sheet may be clear, or, preferably tinted, for example in green, gray or blue. To achieve this, the composition of the glass comprises colorants, in particular iron oxide, in a total weight content (expressed in the form $Fe_2O_3$) between 0.05 and 1.5%, in particular between 0.1 and 1.0%.

Generally, the glass sheet is flat when the electroconductive patterns are deposited. Preferably, it is then bent, usually during the heat treatment curing of the electroconductive patterns. Preferably, then, the finished glazing will be bent.

It is possible to partly coat with enamel the face of the glass sheet on which the first layer is deposited beforehand. Particularly, a black enamel coating could have been deposited by screenprinting on the edge of the glass sheet before some of the electroconductive patterns (including the bus bars) are then deposited on the enamel coating. Such a coating ensures that the joints involved in positioning and fitting the glazing in the opening of the bodywork are concealed and protected from ultraviolet radiation. The enamel coating also conceals the bus bars.

Preferably, the screenprinting step is carried out by positioning a screenprinting screen facing the glass sheet and then depositing, particularly using a scraper, an electroconductive paste, particularly silver-based, on the screenprinting screen. The apertures of the screen are sealed in the corresponding part of the areas of the glass sheet that are not to be covered, so that the paste can move through the screen only in the printing areas, in accordance with a pre-defined pattern.

The electroconductive patterns are preferably formed using a silver-based paste.

Preferably, the silver electroconductive paste, in its wet state, comprises at most 88%, particularly at most 85% by weight of silver, for example 75% to 85%, particularly 80 to 84% by weight of silver. These pastes with high silver content by comparison with the pastes usually employed, are particularly suited to lead-free solder alloys. In order to ensure good solderability and effective resistance in the TCT test, these silver pastes require that stronger thicknesses be applied in the solder areas, which becomes possible by virtue of the method according to the present invention.

The lower the silver content of the paste, the thicker the patterns (of the first layer) in the wet state (before curing) must be for the same thickness of the pattern after curing. Thus, for a pattern thickness of 8 μm after curing, the thickness in the wet state is typically of the order of 25 μm for a paste containing 80% by weight of silver, and of the order of 35 to 40 μm for a paste containing 75% by weight of silver.

Preferably, the paste further comprises a solvent, an organic medium, intended to facilitate the depositing by screenprinting, and a glass frit, which after fusion, attaches the silver particles to the glass sheet.

The screen can be made of any material known to be used in producing screenprinting screens, for example polyester or polyamide.

Preferably, the screen is obtained by means of a photocrosslinkable emulsion coating on at least one part of the screen surface, drying the screen, exposure of the screen in order to cure the photocrosslinkable emulsion in predetermined areas, then washing and drying the screen. The photocrosslinkable emulsion allows to selectively block the screen apertures in areas subject to sun exposure, the washing step, in particular, serving to remove emulsion from the areas not subjected to sun exposure, therefore in the parts where the apertures must remain unblocked and through which the printing paste must pass during the screenprinting and cover the glass sheet to form the electroconductive patterns. The exposure step is the step during which the emulsion photoreticulates, generally under the effect of ultraviolet radiation. Typically, this step is performed by positioning against the screen a slide, comprising a transparent support, typically made of polyester, covered with patterns in ink which is opaque to ultraviolet radiation, corresponding to electroconductive patterns to be printed on the glazing, then said slide is irradiated with ultraviolet radiation. The emulsion is therefore only cross-linked and closes the apertures of the mesh only in the parts of the screen located under the parts of the slide not covered by ink. In the other parts, the emulsion is not cross-linked and is eliminated during the washing step, leaving the apertures open, so that the paste can pass through during the screenprinting.

In this way, identical patterns to those found on the slide are found on the glazing.

According to an embodiment, the aperture size of the screenprint screen is identical at all points. The thickness of the first layer is therefore identical at all points of the glazing.

For example, for the screen, 90 threads per cm can be chosen for thread diameters from 40 to 48 μm.

The wet thickness of the first layer is preferably between 25 and 30 μm, giving thicknesses after heat treating of the order of 8 μm for silver pastes containing 80% by weight of silver.

According to another embodiment, the print screen comprises a central portion and at least one lateral portion, with the aperture size in the central portion being larger than the aperture size in the at least one lateral portion. Particularly, the number of threads per cm in the central portion is greater than the number of threads per cm in the at least one lateral portion, and the diameter of the threads in the central portion is less than the diameter of the threads in the at least one lateral portion.

In the context of this embodiment, the following can be advantageously chosen:
  in the central portion, 77 threads per cm for a diameter of 48 μm, 77 threads per cm for a diameter of 55 μm, 90 threads per cm for a diameter of 48 μm,
  in the, or each, lateral portion, 42 threads per cm for a diameter of 80 μm, 48 threads per cm for a diameter of 80 μm, 49 threads per cm for a diameter of 70 μm.

This type of screen particularly facilitates depositing a greater thickness of electroconductive paste at lateral portions, which correspond to the positioning of the bus bars, in comparison with the areas of printing corresponding to the finer threads of the heating network. Products such as Vario® by SEFAR or Variant® by SAATI, can be cited as examples of this type of mesh, which enables different thicknesses to be obtained in different areas of the glazing unit during one printing operation.

Preferably, the screen is rectangular or reasonably rectangular and the central portion corresponds to the rectangular portion, extending along the whole length of the small sides of the screen, the perpendicular bisector of the small sides corresponding to the perpendicular bisector of the large sides of the screen, and which occupies 20 to 40% of the surface area of the screen. Preferably, the screen comprises two lateral portions, corresponding to the two rectangular portions arranged symmetrically with respect to the perpendicular bisector of the large sides of the rectangle, on both sides of this latter, and occupying 20 to 40% of the surface area of the screen.

Preferably, the digital printing will be carried out with a printhead whose movement (in particular the position and the speed) is controlled by a computer. Several printing techniques may be used.

The digital printing technique, for example, involves inkjet printing. To do this, the printhead comprises nozzles through which ink drops are projected locally onto the glass sheet. This technique is sometimes called "drop on demand" (DOD).

The digital printing technique can also take the form of transfer printing, particularly by laser transfer. For example, a support, particularly rotary, coated with ink (herein the conducting paste) is arranged facing the glass sheet and the printhead locally emits a laser beam aimed at a part of the support, resulting in the creation of a drop of ink which is deposited on the glass sheet.

The latter technique is preferable because the inkjet printing technique requires extremely fine particles, compatible with the diameters of the nozzles, as well as pastes with very low viscosity. In contrast, the transfer printing techniques do not involve any constraints in terms of the composition or the grain texture of the conducting pastes.

In all circumstances, the ink preferably comprises a glass frit, a solvent and silver particles.

The thickness of the electroconductive patterns in the or each extra thickness area is preferably at least 8 μm, in particular between 10 and 20 μm, or even between 10 and 15 μm after the curing heat treatment step. Such a thickness allows meeting the requirements of the TCT test.

The thickness of the patterns in areas other than the extra thickness area is preferably 8 μm at most, in particular between 3 and 7 μm.

The glazing may or may not be dried after the paste is applied. Next, the glazing is heat treated in order to cure the first and second layers. This heat treatment typically takes the form of bending and/or tempering the glass. Bending can be carried out using gravity, for example (the glass deforms under its own weight) or through pressing, at temperatures typically ranging from 550 to 720° C.

The finished glazing is notably a rear window for a motor vehicle, a side window for a motor vehicle or even a windscreen for a motor vehicle.

The electroconductive patterns are notably antennae, bus bars, alarm wires and/or heating wires. The bus bars are preferably located in the two lateral portions of the glazing on opposite sides. For the most part, the heating wires are preferable located in the central portion of the glazing, and extending in parallel along the long edge of the glazing between the two bus bars. This is particularly the case for a rear window.

Preferably, the or each extra thickness area encompasses or is a soldering area for the connection of an antenna and/or a heating network and/or an alarm network.

In the case of a windscreen, the electroconductive patterns are notably antennae.

The electroconductive patterns may also be heating wires, ensuring local heating in the camera windows, for example to detect the distance to the vehicle in front.

In the case of a lateral window, the electroconductive patterns are notably antennae or alarm wires.

The following example embodiments, illustrated in FIG. 1, will serve to make the invention easier to understand.

FIG. 1 shows a glazing obtained according to the invention; in the example, a rear window of a motor vehicle.

The glazing 1 comprises a glass sheet 2 having a central portion A and two lateral portions C. In portions A and C, electroconductive patterns 4, 6, 8, 10, more specifically a network of 4 horizontal and vertical heating wires, were printed, connected in the lateral portions C to bus bars 8, an antenna 6, a soldering area for antenna buttons 10. In each lateral portion C, the bus bars 8 comprise a soldering area 12 for powering the heating network. The position of the soldering areas 12, in the low part of the bus bars 8, is represented in the FIGURE by the dotted lines.

The wires 4 and 6, and the bus bars 8 as well as the antenna button 10 were screenprinted with a silver paste (comprising 80% by weight of silver) on the glass sheet 2, to form a first layer whose wet thickness at the bus bars was 25 µm in the example (giving a thickness of 8 µm after curing). In a previous step, a coating of black enamel (not shown) was deposited by screenprinting on the edge of the glass sheet 2, in the form of a peripheral band. The electroconductive patterns 6, 8 and 10, were therefore deposited on this enamel coating.

In a second step, while the first layer was still wet, therefore with no intermediate drying step, a second layer was deposited by digital printing by means of laser transfer of a silver paste onto certain areas 10A, 12A of the first layer, shown by a darker color. Area 10A is an area corresponding to a soldering area for connecting antenna 6. Areas 12A are areas located on the bus bars 8 and encompass the soldering areas for connecting the heating network.

Therefore, the electroconductive patterns have a greater thickness in the extra thickness areas 10A and 12A than in the other areas, because they are composed of the superimposed first and second layers.

Here, the extra thickness areas 12A are wider than the soldering area 12 proper, and therefore "overflow" beyond this area, in order to prevent unwanted heating in the areas located in the vicinity of the soldering area. In another embodiment, the extra thickness areas 12A may correspond exactly to the soldering areas 12.

The glass sheet was then subject to bending heat treatment at a temperature of approximately 620° C., a step during which the curing of the first and second layers was also performed.

After curing, the thickness in the extra thickness areas 10A and 12A was typically of the order of 10 to 15 µm. In the other areas, the thickness was 8 µm.

The invention claimed is:

1. A method for obtaining a glazing comprising a sheet of glass covered on a face thereof with electroconductive patterns having in at least one area, forming an extra thickness area, a greater thickness than in other areas of said face, the electroconductive patterns comprising heating wires and one or more busbars, said method comprising depositing by screenprinting a first electroconductive layer forming both said heating wires and said one or more busbars on said face of said glass sheet, followed by depositing by a digital printing technique, in the at least one extra thickness area, a second electroconductive layer on the first electroconductive layer while the first electroconductive layer is still wet, then performing a heat treatment step to cure the first and second electroconductive layers,
wherein the extra thickness area encompasses a soldering area, and
wherein the method comprises an extra step of soldering at least one connector to at least part of said extra thickness area.

2. The method according to claim 1, wherein the electroconductive patterns comprise electroconductive tracks located in at least one lateral portion and in a central portion of the glazing, with extra thickness areas being located in said central portion and/or in at least one lateral portion.

3. The method according to claim 2, wherein the extra thickness areas are located in the central portion and in the lateral portions.

4. The method according to claim 1, comprising, before depositing the first electroconductive layer, a prior step of depositing by screenprinting a black enamel coating at an edge of the glass sheet, on which part of the electroconductive patterns is deposited.

5. The method according to claim 1, wherein the digital printing technique is transfer printing.

6. The method according to claim 5, wherein the transfer printing is laser transfer.

7. The method according to claim 1, wherein the electroconductive patterns are formed from a silver paste.

8. The method according to claim 7, wherein the silver paste comprises in its wet state a maximum of 88% by weight of silver.

9. The method according to claim 1, wherein the thickness of the electroconductive patterns in the at least one extra thickness area is at least 8 µm after the curing heat treatment step.

10. The method according to claim 9, wherein the thickness of the electroconductive patterns in the at least one extra thickness area is between 10 and 20 µm after the curing heat treatment step.

11. The method according to claim 1, wherein a drying step is implemented between the step of depositing the second electroconductive layer and the curing heat treatment step.

12. The method according to claim 1, wherein the connector is metallic and the soldering is carried out using a tin-based, silver-based or copper-based soldering alloy.

13. The method according to claim 12, wherein the connector is made of steel containing chrome.

* * * * *